US012622235B2

(12) United States Patent     (10) Patent No.: US 12,622,235 B2

Hsiao et al.     (45) Date of Patent: May 5, 2026

(54) METHOD OF MANUFACTURING SEMICONDUCTOR DEVICE

(71) Applicant: Taiwan Semiconductor Manufacturing Company, Ltd., Hsinchu (TW)

(72) Inventors: Chih-Min Hsiao, Hsinchu (TW); Chien-Wen Lai, Hsinchu (TW); Shih-chun Huang, Hsinchu (TW); Yung-Sung Yen, New Taipei (TW); Chih-Ming Lai, Hsinchu (TW); Ru-Gun Liu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 18/660,980

(22) Filed: May 10, 2024

(65) Prior Publication Data

US 2024/0297042 A1     Sep. 5, 2024

Related U.S. Application Data

(63) Continuation of application No. 18/123,820, filed on Mar. 20, 2023, now Pat. No. 12,014,926, which is a
(Continued)

(51) Int. Cl.
*H10P 76/40*     (2026.01)
*H10B 10/00*     (2023.01)

(52) U.S. Cl.
CPC ........ *H10P 76/4085* (2026.01); *H10P 76/405* (2026.01); *H10P 76/4088* (2026.01); *H10B 10/00* (2023.02)

(58) Field of Classification Search
CPC ............... H10P 76/4085; H10P 76/405; H10P 76/4088; H10B 10/00; H01L 21/76816; H01L 21/0337
See application file for complete search history.

(56) References Cited

U.S. PATENT DOCUMENTS

| | | |
|---|---|---|
| 4,573,257 A | 3/1986 | Hulseweh |
| 6,025,273 A | 2/2000 | Chen et al. |
| (Continued) | | |

OTHER PUBLICATIONS

Notice of Allowance issued in U.S. Appl. No. 16/503,277, dated Dec. 23, 2020.

(Continued)

*Primary Examiner* — Dao H Nguyen
(74) *Attorney, Agent, or Firm* — STUDEBAKER BRACKETT PLLC

(57) ABSTRACT

A method of defining a pattern includes forming a plurality of cut shapes and a first plurality of openings within a first layer of a multi-layer hard mask to expose first portions of the second layer. A plurality of etch stops is formed by implanting an etch rate modifying species in a portion of the plurality of cut shapes. The first layer is directionally etched at the plurality of cut shapes such that the plurality of etch stops remain. A spacer layer is formed on the first layer and the first portions. A second plurality of openings is formed within the spacer layer to expose second portions of the second layer. The spacer layer is directionally etched to remove the spacer layer from sidewalls of the plurality of etch stops. Portions of the second layer exposed through the first plurality of openings and the second plurality of openings are etched.

20 Claims, 12 Drawing Sheets

Related U.S. Application Data continuation of application No. 17/240,692, filed on Apr. 26, 2021, now Pat. No. 11,610,778, which is a continuation of application No. 16/503,277, filed on Jul. 3, 2019, now Pat. No. 10,991,583.

(60) Provisional application No. 62/738,456, filed on Sep. 28, 2018.

(56) References Cited

U.S. PATENT DOCUMENTS

| | | | |
|---|---|---|---|
| 7,989,352 B2 | 8/2011 | Feustel et al. | |
| 8,642,483 B2 | 2/2014 | Honda | |
| 10,629,435 B2 * | 4/2020 | Swaminathan | ... H01L 21/31138 |
| 10,727,061 B2 | 7/2020 | Yang et al. | |
| 2010/0267238 A1 | 10/2010 | Johnson et al. | |
| 2011/0104901 A1 | 5/2011 | Yatsuda et al. | |
| 2012/0202301 A1 * | 8/2012 | Yaegashi | G03F 7/0035 |
| | | | 257/E21.53 |
| 2013/0078778 A1 * | 3/2013 | Chien | H10D 30/024 |
| | | | 438/296 |
| 2015/0262836 A1 | 9/2015 | Lu et al. | |
| 2016/0268143 A1 | 9/2016 | Chen et al. | |
| 2018/0138040 A1 * | 5/2018 | LaVoie | C23C 16/042 |
| 2019/0148157 A1 | 5/2019 | Zhang et al. | |
| 2019/0148159 A1 * | 5/2019 | Huang | H01L 21/67075 |
| | | | 438/689 |
| 2021/0265173 A1 * | 8/2021 | Yu | C23C 16/34 |

OTHER PUBLICATIONS

Notice of Allowance issued in U.S. Appl. No. 17/240,692, dated Nov. 21, 2022.
Notice of Allowance issued in U.S. Appl. No. 18/123,820, dated Feb. 12, 2024.

* cited by examiner

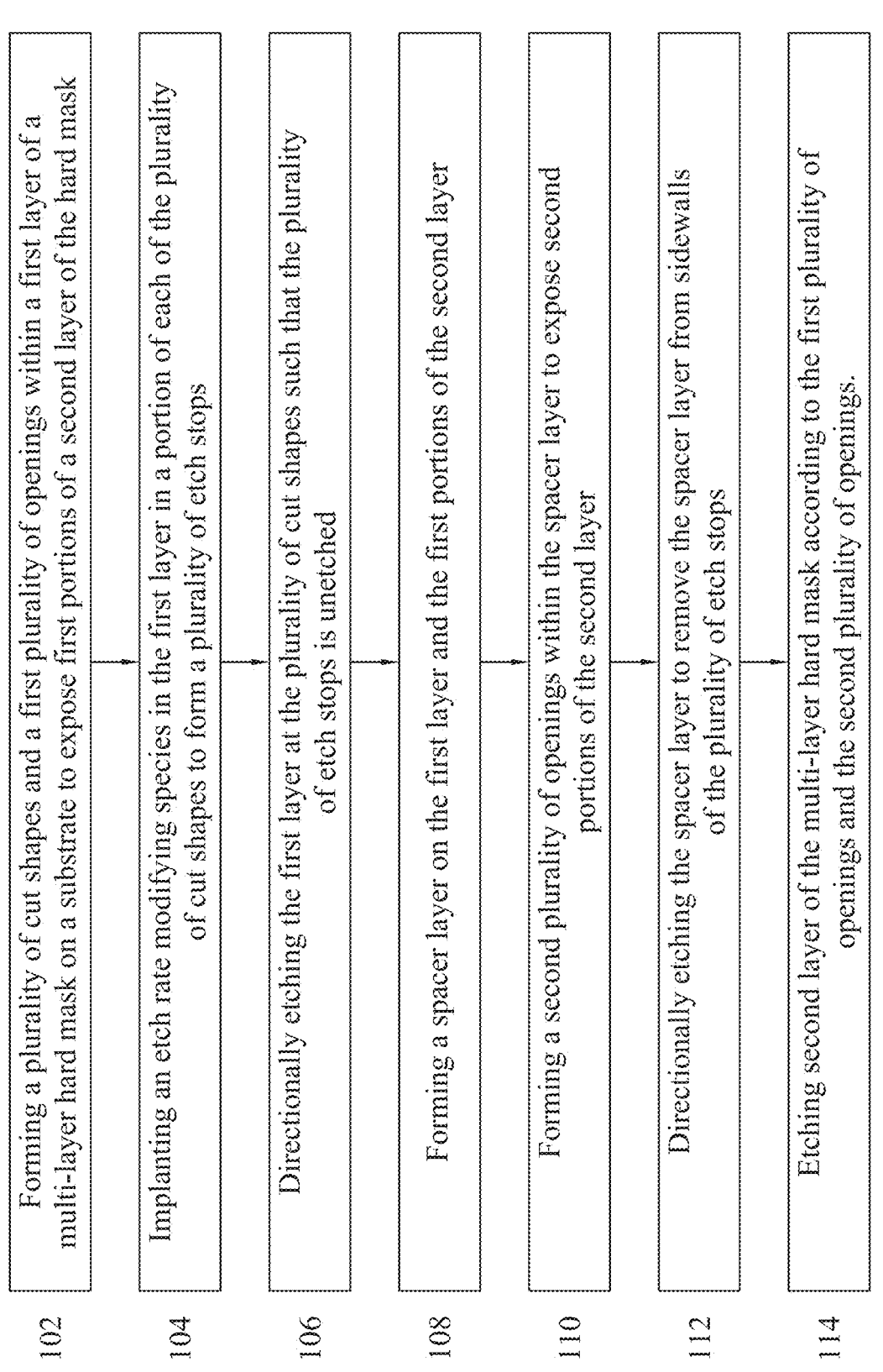

102 — Forming a plurality of cut shapes and a first plurality of openings within a first layer of a multi-layer hard mask on a substrate to expose first portions of a second layer of the hard mask 104 — Implanting an etch rate modifying species in the first layer in a portion of each of the plurality of cut shapes to form a plurality of etch stops 106 — Directionally etching the first layer at the plurality of cut shapes such that the plurality of etch stops is unetched 108 — Forming a spacer layer on the first layer and the first portions of the second layer 110 — Forming a second plurality of openings within the spacer layer to expose second portions of the second layer 112 — Directionally etching the spacer layer to remove the spacer layer from sidewalls of the plurality of etch stops 114 — Etching second layer of the multi-layer hard mask according to the first plurality of openings and the second plurality of openings.

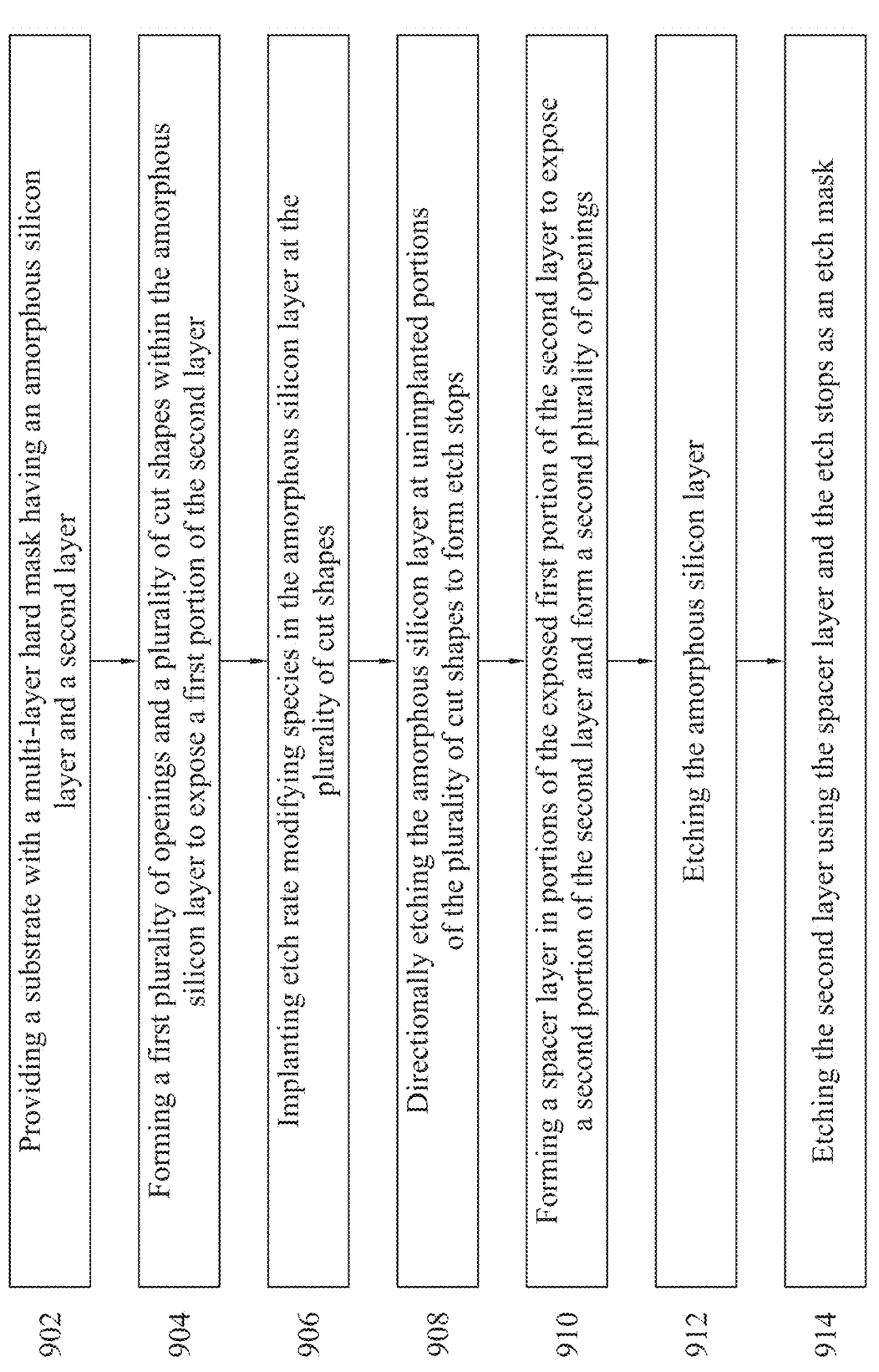

902 — Providing a substrate with a multi-layer hard mask having an amorphous silicon layer and a second layer 904 — Forming a first plurality of openings and a plurality of cut shapes within the amorphous silicon layer to expose a first portion of the second layer 906 — Implanting etch rate modifying species in the amorphous silicon layer at the plurality of cut shapes 908 — Directionally etching the amorphous silicon layer at unimplanted portions of the plurality of cut shapes to form etch stops 910 — Forming a spacer layer in portions of the exposed first portion of the second layer to expose a second portion of the second layer and form a second plurality of openings 912 — Etching the amorphous silicon layer 914 — Etching the second layer using the spacer layer and the etch stops as an etch mask

FIG. 9

METHOD OF MANUFACTURING SEMICONDUCTOR DEVICE

CROSS-REFERENCE TO RELATED APPLICATIONS

This application is a Continuation of U.S. patent application Ser. No. 18/123,820 filed on Mar. 20, 2023, which is a Continuation of U.S. patent application Ser. No. 17/240,692 filed on Apr. 26, 2021, now U.S. Pat. No. 11,610,778, which is a Continuation of U.S. patent application Ser. No. 16/503,277 filed on Jul. 3, 2019, now U.S. Pat. No. 10,991,583, which claims priority to U.S. Provisional Applications No. 62/738,456 filed on Sep. 28, 2018, the entire disclosure of each of which are incorporated herein by reference.

TECHNICAL FIELD

The present disclosure relates generally to a process of fabricating an integrated circuit, and more specifically to a self-aligned litho-etch (SALE) process.

BACKGROUND

As the size of semiconductor devices becomes smaller than the wavelength of illumination used in photolithography tools, techniques such as double patterning are used to obtain patterns for printing critical design layers. However, some double patterning techniques such as litho-etch, litho-etch (LELE) suffer from potential degradation due to misalignment or overlay issues. Techniques such as self-aligned double patterning (SADP) have been developed to avoid problems such as misalignment and overlay errors.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method of performing a self-aligned litho-etch patterning in accordance with an embodiment of the present disclosure.

FIG. 9 illustrates a flow chart of a method of performing a self-aligned litho-etch patterning in accordance with another embodiment of the present disclosure.

DETAILED DESCRIPTION

Figure 2A:
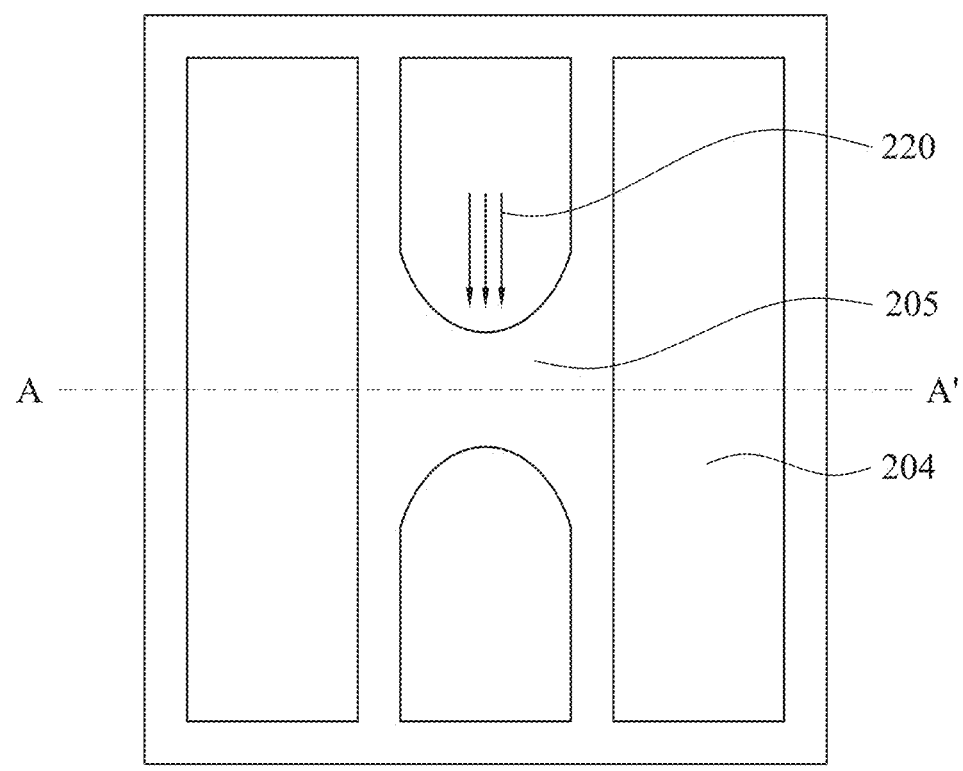
FIGS. 2A, 3A, 4A, 5A, 6A, 7A and 8A are schematic top views of a substrate corresponding to various acts of the method of performing a SALE process in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Self-aligned double patterning (SADP) is used for forming repetitive structures such as, for example, array bit lines in memory arrays (e.g., SRAM memory arrays). In a typical SADP process for an SRAM array, a spacer layer is formed on sidewalls of minimum pitch openings in a patterned photoresist layer formed over a substrate during a first photolithography process. After formation of the spacer layer on the sidewalls, the patterned photoresist layer is removed using a second photolithography process, leaving spacers separated by a space smaller than that achievable by the first photolithography process (e.g., since there are two spacers within a line). The substrate is selectively patterned according to the spacer layer to form a dense array of lines.

A cut mask is typically used to form line-end to line-end spaces in the array of lines. However, because cuts of shapes formed by the first lithography step are performed before the shapes are lithographically formed, the end-to-end spaces between shapes formed using the second lithography step are larger than the end-to-end spaces between shapes formed using the first lithography step. Moreover, the end-to-end space is limited by the resolution limit of the lithography step. In other words, while double patterning can reduce the distance between adjacent shapes in half the lithographic resolution limit, the end-to-end distance is still limited by the lithographic resolution limit.

Accordingly, some aspects of the present disclosure provide for a method of performing a self-aligned litho-etch process that provides for end-to-end spaces smaller than the photolithography resolution limit. In some embodiments, the method is performed by forming a plurality of cut shapes and a first plurality of openings within a first layer of a multi-layer hard mask of a substrate. The multi-layer hard mask includes a first layer disposed on an underlying second layer, which is in turn disposed on the substrate. The first plurality of openings exposes first portions of the second layer. Each cut shape is used to create openings in the first layer at the two ends of the cut shape to expose the second layer, but to keep the first layer in a portion of the cut shape between the two ends. The first layer is then implanted with etch rate modifying species in the portion of each of the plurality of cut shapes between the two ends to form a plurality of etch stops. The first layer is then directionally etched at the plurality of cut shapes such that the plurality of etch stops remain. A spacer layer is then formed on the first layer and first portions of second layer. A second plurality of openings is then formed within the spacer layer to expose second portions of the second layer. The spacer layer is then directionally etched to remove the spacer layer from sidewalls of the plurality of etch stops. The second layer of the multi-layer hard mask is then etched according to the first plurality of openings and the second plurality of openings.

FIG. 1 illustrates a flow chart of a method of performing a self-aligned litho-etch patterning in accordance with an embodiment of the present disclosure. In an embodiment, the method includes, at 102, forming a plurality of cut shapes and a first plurality of openings within a first layer of a multi-layer hard mask on a substrate. The hard mask, in some embodiments, includes a first layer and an underlying second layer disposed on a semiconductor substrate. In some embodiments, an additional third layer underlies the second layer. Forming the plurality of cut shapes and the first plurality of openings in the first layer exposes first portions of the second layer, where the first layer has been removed. In some embodiments, the plurality of shapes and the first plurality of openings can be formed using a lithographic process (referred to herein as the first lithographic process) by lithographically forming a corresponding pattern in a pattern transfer layer deposited on the first layer, and selectively etching the first layer using the patterned pattern transfer layer as an etch mask.

At 104, a portion of each of the plurality of cut shapes is implanted with an etch rate modifying species to form a plurality of etch stops. In some embodiments, the etch rate modifying species is selected from the group consisting of nitrogen, oxygen, fluorine, arsenic, boron, carbon, phosphorus, gallium, indium, aluminum, antimony, germanium and any combination thereof. In some embodiments, the species is implanted at a concentration at which the etch rate of the implanted portion of the material of the first layer decreases. The decrease in etch rate (i.e., increase in etch resistance) is at least by a factor of two in some embodiments. In other embodiments, the etch resistance increases by a factor of, for example, three, four, five, ten, or any other factor between any two of these factors, or more. The increase in etch resistance is determined by factors such as the type of implanted species, the amount of implanted species, the current used for implanting the species (which also determines the depth and density of implantation), amount of time for which implantation is performed, etc.

In various embodiments, the implantation is performed by first depositing an implantation mask on plurality of cut shapes, creating an implantation opening in a portion of the implantation mask, and implanting the etch rate modifying species through the implantation opening. In other embodiments, the ion implantation process is selectively applied, such as by using a patterned implant. In various embodiments, directional ion implantation is used to expose sidewall surfaces of a patterned hard mask layer to species that reduce the etch rate. For directional ion implantation, energetic species are aimed at the sidewall surfaces of the patterned hard mask layer. The species that enter the sidewall by directional ion implantation may reduce the etch rate of the sidewalls. The implanted species may be diffused further inside the sidewalls.

At 106, the first layer of the hard mask is directionally etched at the plurality of cut shapes such that the plurality of etch stops remain. As referred to herein, directional etching is a process performed to modify a horizontal profile of hard mask features of a patterned hard mask so as to reduce an edge-to-edge distance within a feature in the patterned hard mask. Examples of directional etching include, but are not limited to, selective reactive ion etching or other selective dry etching processes. In such techniques, an etching species or energetic species is directed in a substantially horizontal direction relative to a horizontal surface of the substrate, thereby achieving horizontal etching of the patterned hard mask.

Various etching parameters can be tuned to generate etching species (radicals) that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some embodiments, RF bias voltage is tuned to achieve an electric field that causes etching species to flow substantially horizontally along an in-plane direction (for example, in the y axis direction) relative to a surface over the substrate. In some embodiments, the etching species are tuned to have a profile of momenta of the energetic species such that the momenta of the etching species or energetic species along a frontline are not the same, i.e. the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

After the directional etching of the first layer, the width of the plurality of cut shapes is reduced. In other words, the etch stops have a size smaller than the size of the corresponding cut shape. Additionally, the etch stops are formed of doped first layer material. Thus, by controlling size of the portion of the cut shape being implanted, the etch resistance provided by the implantation process, and the depth of the directional etching process, an etch stop having a size smaller than lithographic resolution limit can be obtained. These etch stops, as will be described elsewhere herein, are used to define the edge-to-edge spacing between shapes formed by a SALE process.

At 108, a spacer layer is formed over the first layer and the first portions of the second layer (i.e., portions of the second layer exposed through the first plurality of openings and portions of the plurality of cut shapes that are etched away by directional etching at 106). The spacer layer is formed of a material (referred to herein as the "spacer material") selected from the group consisting of silicon dioxide, silicon nitride, titanium oxide, aluminum oxide and any combination thereof. The spacer material is deposited by way of a suitable vapor deposition technique such as, for example, chemical vapor deposition, physical vapor deposition, etc., such that the spacer layer is blanket deposited on the exposed surfaces of the second layer as well as on the side walls of the etched first layer.

At 110, a second plurality of openings are formed within the spacer layer to expose second portions of the second layer. In some embodiments, the second plurality of openings are formed by etching the spacer material isotropically. In such embodiments, the spacer material is isotropically etched such that the spacer material disposed over a horizontal surface of the first layer is removed. Such etching also removes a portion of the spacer material disposed directly on the second layer of the hard mask over the exposed first portions, similar to the spacer etching step in a conventional SADP process.

In some embodiments, the second plurality of openings are formed using a lithographic process including forming a second pattern transfer layer, patterning the second pattern transfer layer according to a pattern of the second plurality of openings, etching the spacer material according to the pattern using the second pattern transfer layer as an etch mask, and then removing the second pattern transfer layer.

At 112, the spacer layer is directionally etched to remove the spacer material from sidewalls of the plurality of etch stops. Because the spacer material is deposited conformally at 108, the spacer material is also deposited on the sidewalls of the plurality of etch stops. As noted elsewhere herein, the etch stops are formed to define cuts in a plurality of shapes formed on the semiconductor substrate. Thus, the spacer material deposited on the sidewalls increases the end-to-end spacing between the plurality of shapes when the second layer of the hard mask is etched using the spacer layer and the remaining first layer (including the etch stops) as etch masks. Thus, directionally etching the spacer material to remove the spacer material from the sidewalls of the etch stops reduces the end-to-end spacing between the plurality of shapes, and increases device density in some embodiments.

At 114, portions of the second layer exposed through the first plurality of openings and the second plurality of openings are etched using the first layer, the spacer layer and the plurality of etch stops as etch masks. In some embodiments, the first layer, the spacer layer and the plurality of etch stops are then etched away to form the plurality of shapes in the second layer defined by the first plurality of openings and the second plurality of openings. The end-to-end spacing between the plurality of shapes is defined by the etch stops. Because the size of the etch stops is governed by the implantation mask, and can be smaller than the lithographic resolution limit depending on the implantation profile, the method described herein provides end-to-end spacing that is smaller than the lithographic resolution limit.

FIGS. 2A, 3A, 4A, 5A, 6A, 7A and 8A are schematic top views of a substrate corresponding to various operations of the method of performing a SALE process in accordance with some embodiments of the present disclosure. FIGS. 2B, 3B, 4B, 5B, 6B, 7B and 8B are corresponding schematic cross-section views of a substrate across like A-A' corresponding to various operations of the method of performing SALE process in accordance with some embodiments of the present disclosure.

Figure 2B:
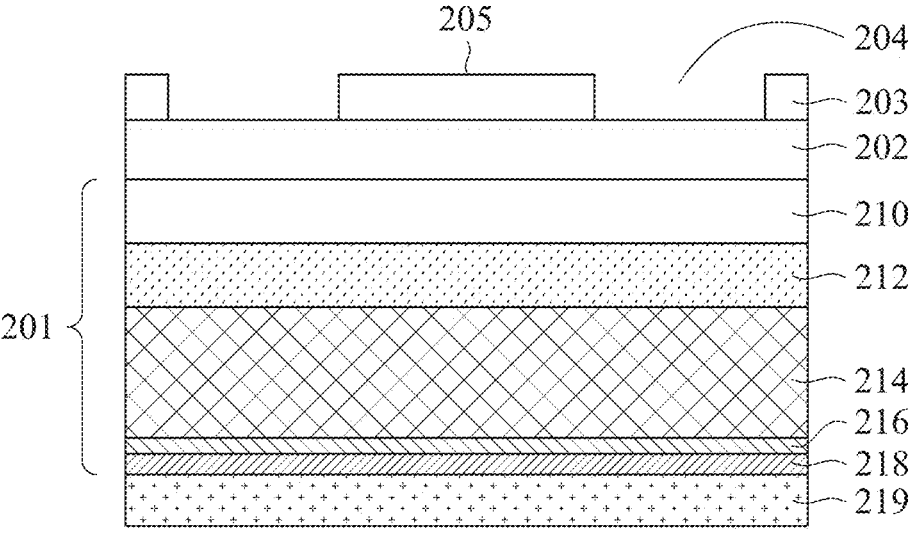
FIGS. 2B, 3B, 4B, 5B, 6B, 7B and 8B are corresponding schematic cross-section views of a substrate corresponding to various acts of the method of performing SALE process in accordance with some embodiments of the present disclosure.

FIGS. 2A and 2B show a multi-layer hard mask including a first layer 203 and a second layer 202 on top of a bottom layer 201. In some embodiments, the first layer 203 is formed of a semiconductor material, such as amorphous silicon and polysilicon, and the second layer 202 is formed of a dielectric material, such as tetraethyl orthosilicate (TEOS) or silicon oxide. In various embodiments, bottom layer 201 includes one or more layers, e.g., six layers. Bottom layer 201 may include layer 210 that is a metal nitride layer such as titanium nitride (TiN) with a thickness of about 20 nm to about 40 nm. Bottom layer 201 includes layer 212 that is a TEOS-based dielectric material with a thickness of about 20 nm to about 40 nm. Bottom layer 201 includes layer 214 that is low dielectric constant (K) layer, such as SiOC, porous material and organic material, with a thickness of about 80 nm to about 150 nm. In various embodiments, bottom layer 201 further includes layer 216 with a thickness of about 5 nm to about 40 nm that is made of one or more layers of silicon oxide or silicon nitride based materials such as SiN, SiCN, SiON or SiOCN. Bottom layer 201 also includes layer 218 with a thickness of about 5 nm to about 20 nm that is made of one or more layers of silicon oxide or silicon nitride based materials such as SiN, SiCN, SiON or SiOCN, different from the layer 216. In various embodiments, bottom layer 201 is formed over interlayer dielectric (ILD) layer 219 that is made of one silicon oxide, silicon nitride, silicon oxynitride (SiON), SiOCN, fluorine-doped silicate glass (FSG), or a low-k dielectric material, or any other suitable dielectric material. In various embodiments, the bottom layer 201 is a semiconductor body with or without preexisting device patterns, such as wiring and vias (contacts). It will be appreciated that while only two hard mask layers 203 and 202 are shown for convenience of illustration and understanding, more than two hard mask layers may be provided on top of bottom layer 201. For example, the bottom layer 201 is provided with three hard mask layers in some embodiments. In such embodiments, the third hard mask layer is disposed between bottom layer 201 and the second hard mask layer 202. The third hard mask layer, in various embodiments, is formed of materials such as, for example, titanium nitride or titanium oxide.

Figure 2C:
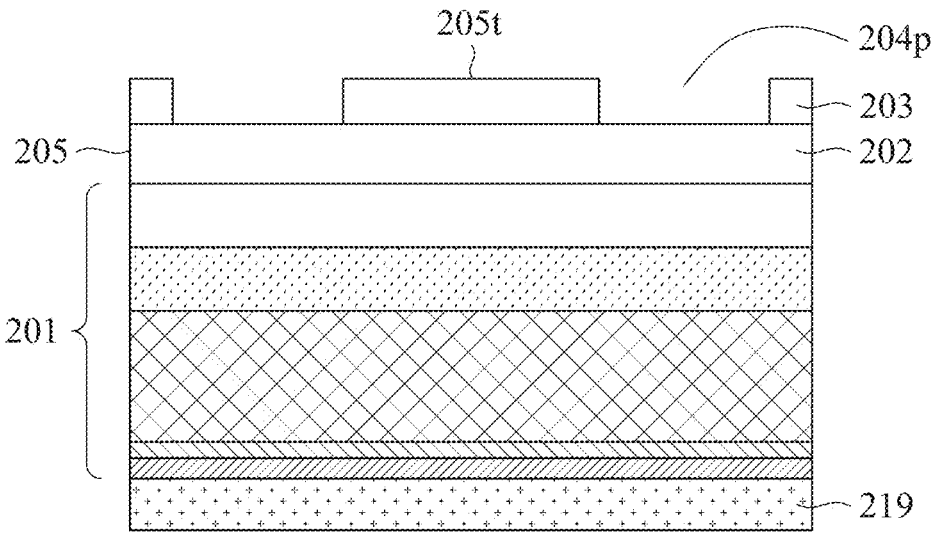
FIGS. 2C and 5C are schematic cross-section views of a substrate corresponding respectively to an operation of forming a first plurality of openings in a first layer of a hard mask and a second plurality of openings in a spacer layer disposed on the first layer.

In an embodiment, a plurality of cut shapes 205 and a first plurality of openings 204 are patterned in the first layer 203. In some embodiments, the patterning is performed using a lithographic process by depositing a first pattern transfer layer 205*t* (see FIG. 2C) on the first layer 203, lithographically patterning the first pattern transfer layer, and transferring the pattern 204*p* into the first layer 203 by etching the first layer 203 through the pattern provided to the first pattern transfer layer. In various embodiments, the lithographic patterning is performed using deep ultraviolet (DUV) radiation or extreme ultraviolet (EUV) radiation. The size of the first plurality of openings 204 is in a range from about 5 nm to about 130 nm in various embodiments. Similarly, the size of the plurality of cut shapes 205 is in a range from about 5 nm to about 130 nm in various embodiments. The size of a particular feature, for the purposes of the present disclosure refers to a dimension of the smallest element of that particular feature. For example, where an opening forms a contact line, the size of the opening for the purposes of the present disclosure refers to the width of the contact line. Likewise, where a cut shape defines the end-to-end spacing of between contact lines, the size of the cut shape is the end-to-end distance between the contact lines. Moreover, while only one cut shape 205 is illustrated in the figures for simplicity of illustration and understanding, it will be appreciated that the plurality of cut shapes 205 can be formed at various locations on the same opening 204 or at different openings 204.

Figure 3A:
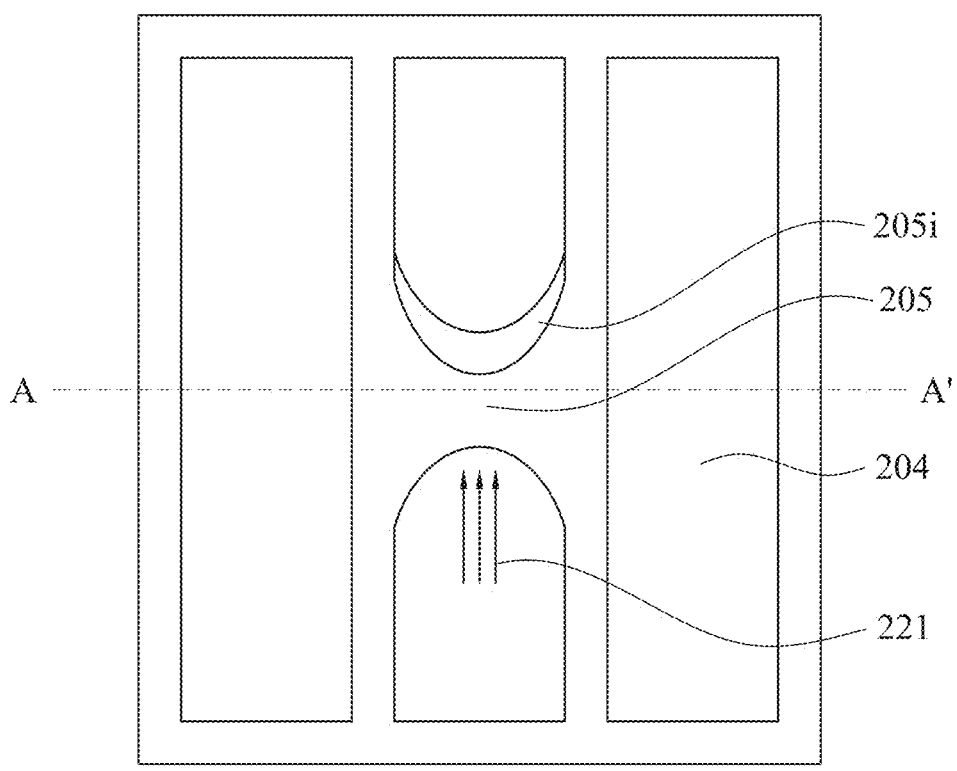
Figure 3B:
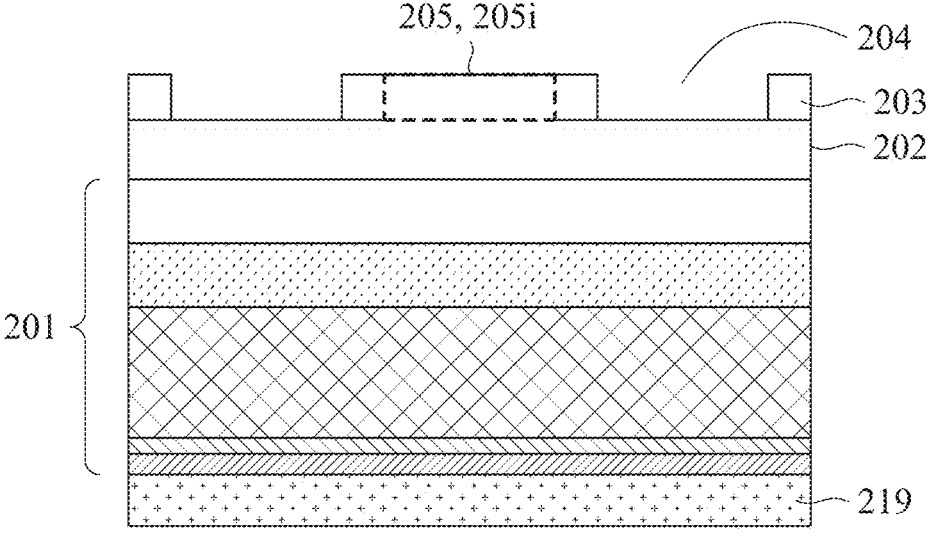

Once the first plurality of openings and the plurality of cut shapes are formed, portions of the plurality of cut shapes 205 are implanted with etch rate modifying species to form etch stops 205*i* as shown in FIGS. 3A and 3B. Examples of etch rate modifying species include, without limitation, ions of materials such as nitrogen, oxygen, fluorine, arsenic, boron, carbon, phosphorus, gallium, indium, aluminum, antimony and germanium. The implantation process, in various embodiments, is performed through an implantation mask or using a patterned implantation process. The extent of modification of the etch rate using the etch rate modifying species is controlled using parameters such as, for example, the type of species being implanted, the current at which the implantation is performed, the energy of the implantation species, the time for which the implantation is performed, etc. In various embodiments, the etch rate of the material of the cut shapes is modified to increase the etch resistance (i.e., decrease the etch rate) of the implanted material compared to the unimplanted material. Thus, the various parameters are controlled, in some embodiments, to increase the etch resistance by at least a factor of two, and in some embodiments, by a factor of three, four, five, ten or more. Direction 220 shows the direction of implantation of etch rate modifying species. Direction 221 shows the direction of etching of the cut shape.

Figure 4A:
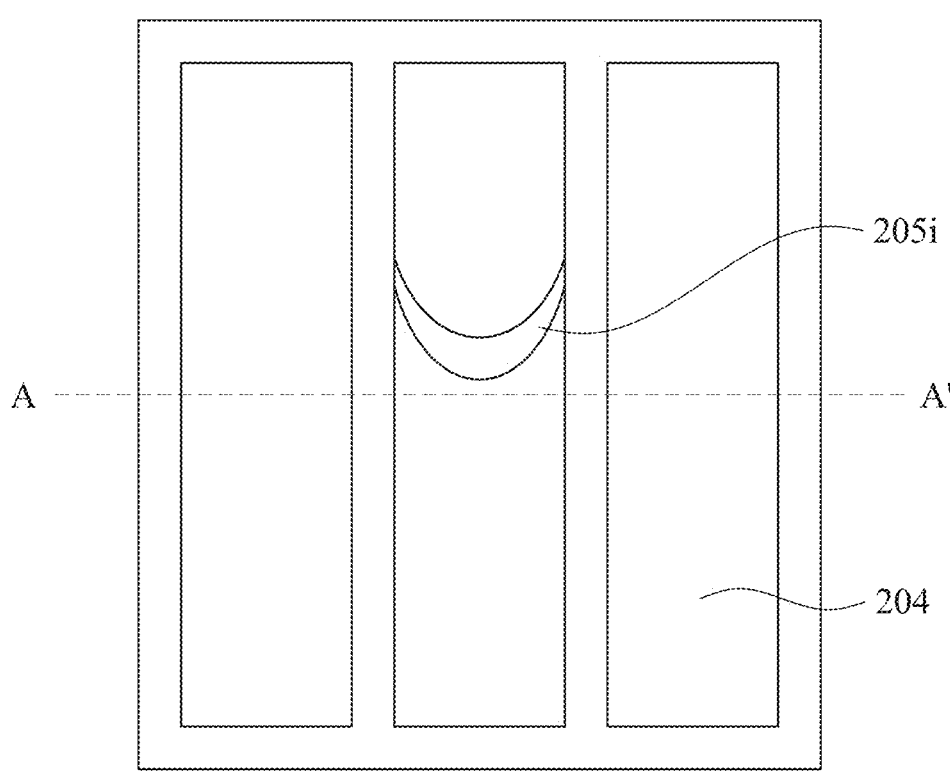
Figure 4B:
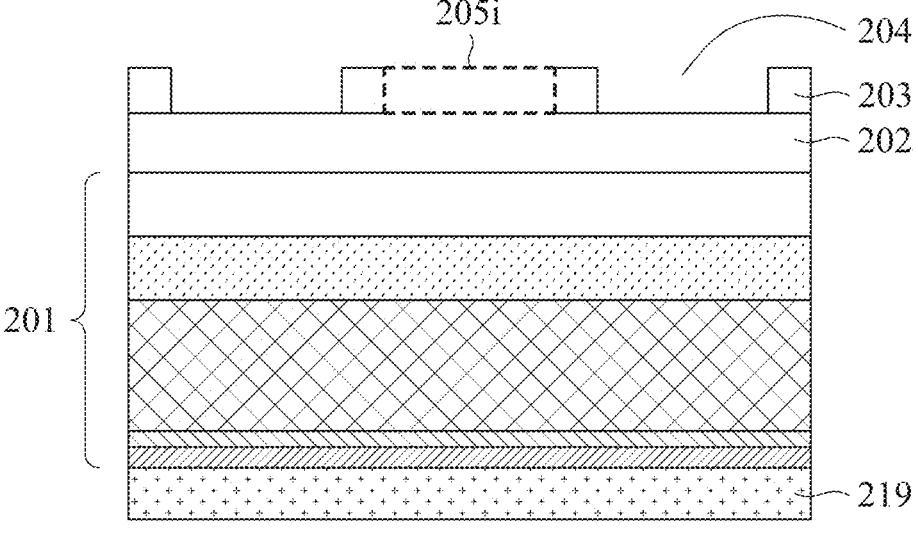

FIGS. 4A and 4B show the structure after directionally etching the unimplanted portions of the plurality of cut shapes 205 formed in the first layer 203. It will be appreciated that because the plurality of cut shapes 205 are formed using a lithographic process in some embodiments, the minimum size of the plurality of cut shapes 205 is limited by the lithographic resolution limit. However, implantation of portions of the cut shapes 205 may be performed using techniques such as patterned implantation that are not limited by the lithographic resolution limit. Thus, the implanted portion 205*i* of the plurality of cut shapes 205 is smaller than the lithographic resolution limit in some embodiments. As discussed elsewhere herein, the size of the implanted portion 205*i* (also referred to herein as the etch stops 205*i*) of the plurality of cut shapes 205 defines the end-to-end spacing between a plurality of shapes on the bottom layer 201 formed in the second layer 202. Thus, by reducing the size of the etch stops 205*i*, a higher density of devices can be obtained. As can be seen in FIGS. 4A and 4B, directional etching removes only the unimplanted portions of the cut shapes 205, while leaving behind the first layer 203 on other portions of the bottom layer 201. Because the implanted portions 205*i* act as etch stops, the directional etching, the cut shapes can be reduced in size using the directional etching without affecting the size of the plurality of openings.

Figure 5A:
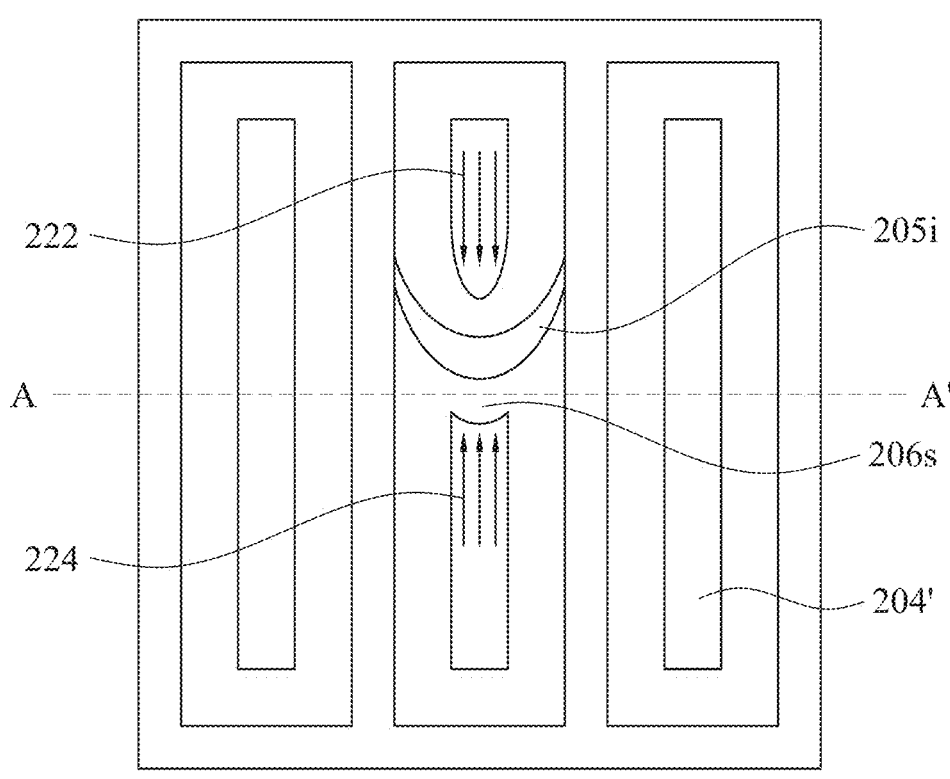
Figure 5B:
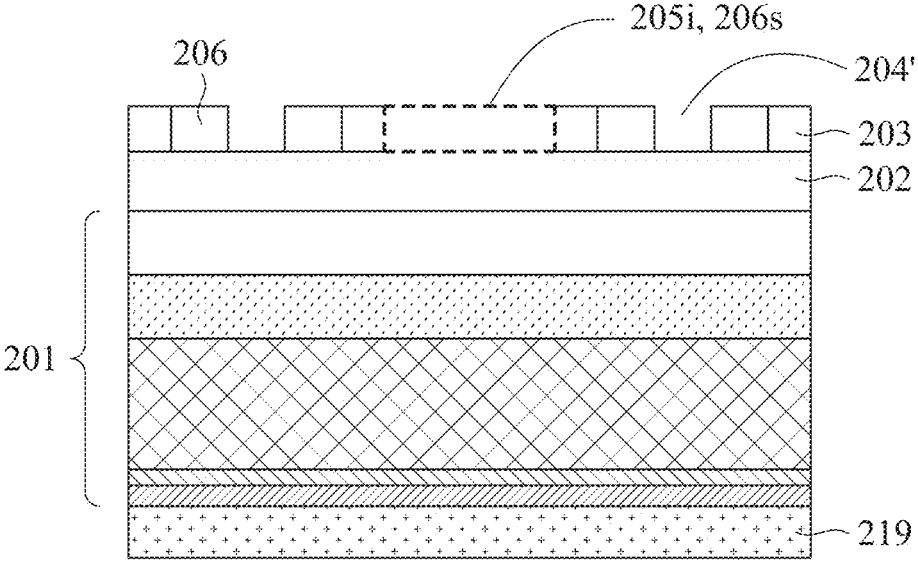

Once the cut shapes are reduced in size to leave behind the etch stops 205*i*, a spacer material is deposited on the first layer 203 and in the first plurality of openings 204 to form a spacer layer 206 (see FIGS. 5A and 5B). Examples of spacer material include, but are not limited to, silicon dioxide, silicon nitride, titanium oxide or aluminum oxide. The spacer material is deposited using a method that allows conformal deposition of the spacer material. For example, in some embodiments, the spacer material is deposited using a chemical vapor deposition method or a physical vapor deposition method. As referred to herein "conformal" deposition means deposition on all exposed surfaces of a given layer. Thus, the spacer material is deposited on a top surface of the first layer 203 as well as on the side walls of the first layer 203 where first openings 204 are formed. In various embodiments, the thickness of spacer layer 206 deposited on the top surface of the first layer 203 (not shown in the figures) and the spacer layer 206 deposited on the side walls of the first layer 203 at the first openings 204 is the same. Thus, the thickness of the spacer layer 206 determines the width of second plurality of openings 204' (see FIGS. 5A and 5B), and in some embodiments, is selected such that the width of the second plurality of openings 204' is less than the lithographic resolution limit.

The spacer material is then patterned to form second plurality of openings 204' shown in FIGS. 5A and 5B. In some embodiments, the second plurality of openings 204' are formed by etching the spacer layer 206 such that the entirety of spacer material deposited over the top surface of first layer 203 and the exposed surface of second layer 202 is removed, while leaving behind the spacer material deposited on the side walls of the first layer 203 in the first plurality of openings 204. In other words, a portion of the spacer material disposed over the second layer 202 is left behind, while another portion is removed to form the second plurality of openings 204'. Directions 222 and 224 show the direction of etching of the spacer layer at the walls of etch stops 205*i*.

Figure 5C:
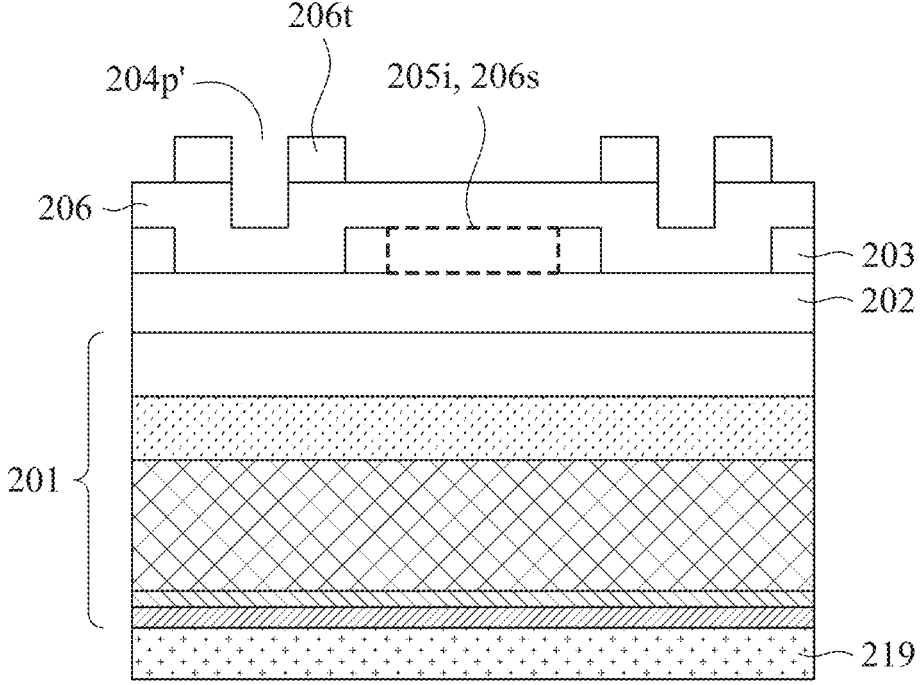

In other embodiments, the second plurality of openings 204' is formed using a lithographic process. In such embodiments, a second pattern transfer layer 206*t* (see FIG. 5C) is disposed over the spacer layer 206, the second pattern transfer layer 206*t* is patterned with a pattern 204*p'* corresponding to the second plurality of openings 204' using a lithographic step, the pattern is transferred to the spacer layer 206 by etching the spacer layer 206 using the second pattern transfer layer 206*t* as an etch mask, and the second pattern transfer layer 206*t* is removed to leave behind spacer layer 206 deposited on portions of the second layer 202 and forming the second plurality of openings 204'.

Figure 6A:
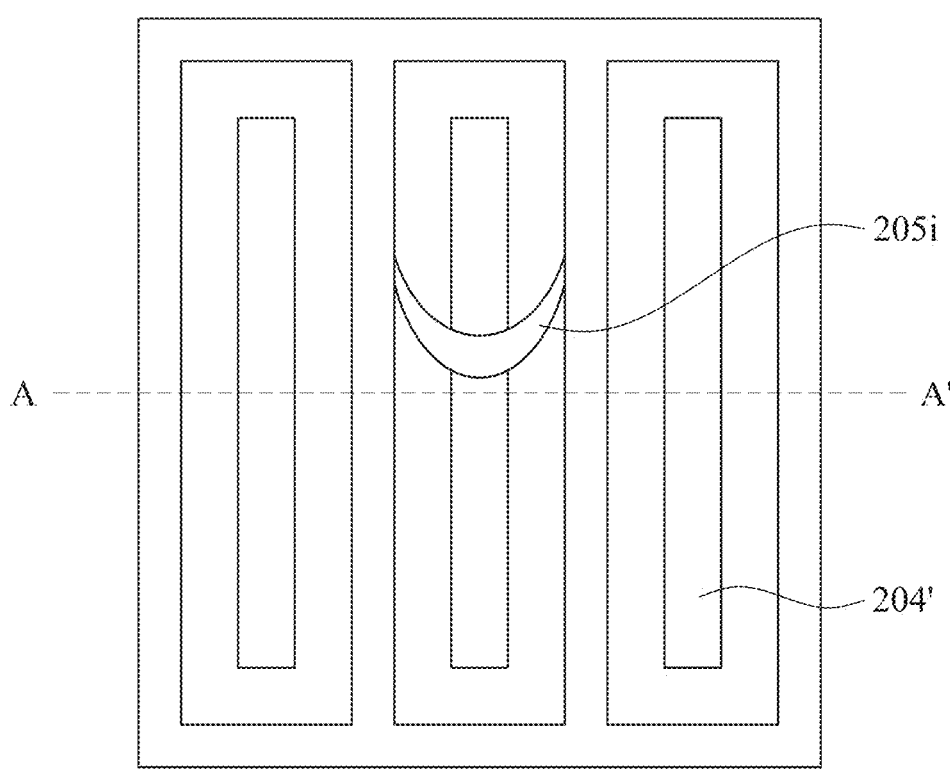
Figure 6B:
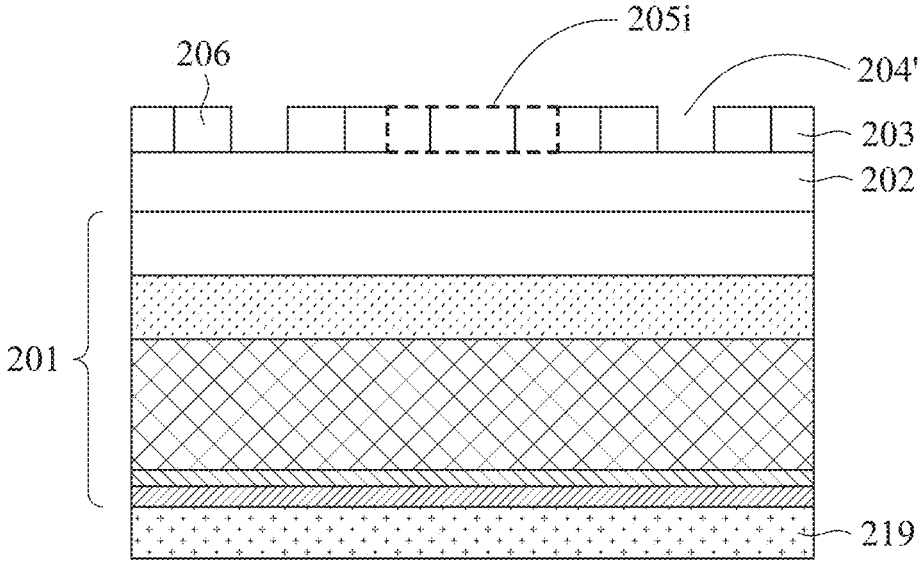

It will be appreciated that because the spacer material is deposited conformally, the spacer material is also deposited over the top surfaces the etch stops 205*i* as well as on the side walls of the etch stops 205*i*. When the spacer material is etched, the portion of the spacer material deposited over the top surface of the etch stops 205*i* is removed. However, some portion of the spacer material deposited on the side walls of the etch stops 205*i* remains. This results in widening of the cut shapes. This remaining portion of the spacer layer 206 deposited on the side walls of the etch stops 205*i* is removed using directional etching as shown in FIGS. 6A and 6B.

Figure 7A:
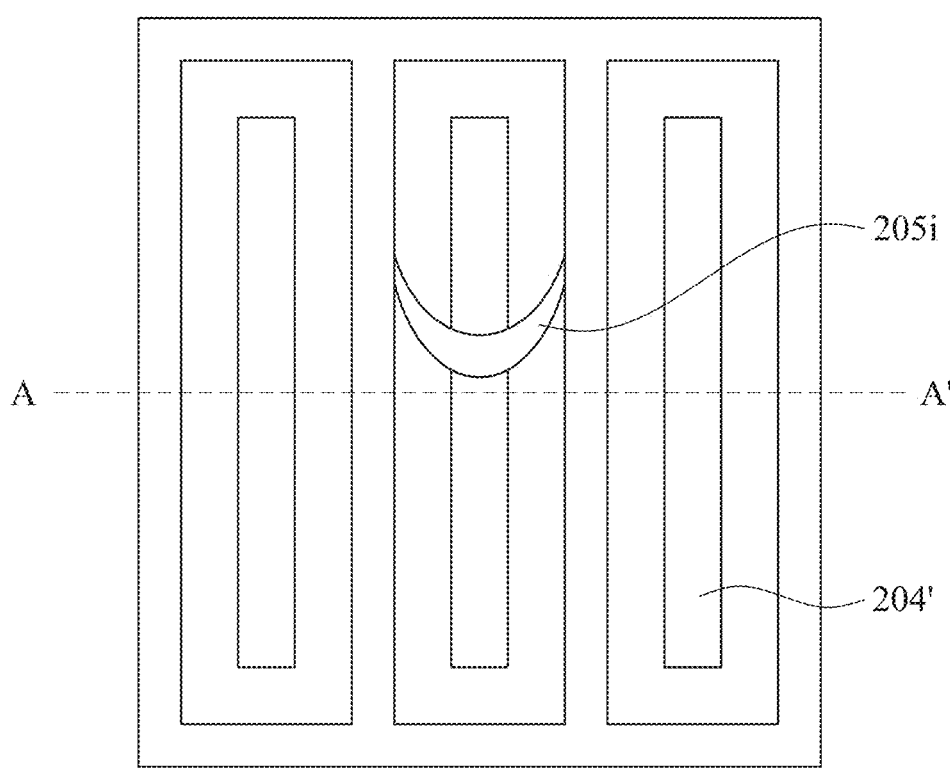
Figure 7B:
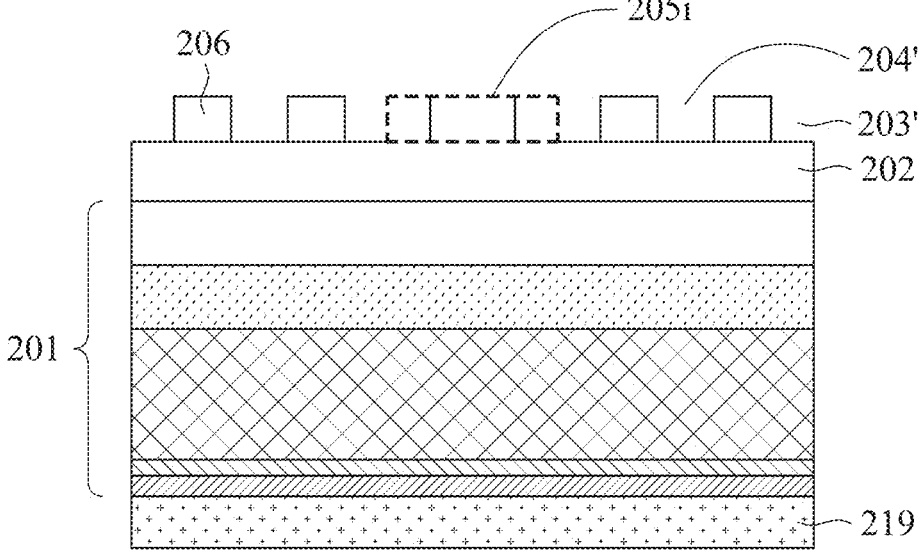

FIGS. 7A and 7B show the structure after removing the first layer 203 while leaving the etch stops 205*i* and the spacer layer 206 to form the second plurality of openings 204' and a third plurality of openings 203' (from where the first layer 203 is removed). The first layer 203, in various embodiments, is removed using any suitable etching process that does not affect any of the other layers including the etch stops 205*i*. As noted, directional etching is use for selectively removing the spacer layer 206*s* deposited on the side walls of the etch stops 205*i*. The directional etching does not affect first layer 203 and second layer 202. Then, the remaining portions of first layer on top of second layer 202 is selectively etched without affecting second layer 202 and remaining portions of spacer layer 206. Finally, second layer 202 is selectively etched using the remaining spacer layer 206 and etch stops 205*i* as the etch mask and exposing bottom layer 201 underneath layer 202 at second plurality of openings 204' and third plurality of openings 203'.

Figure 8A:
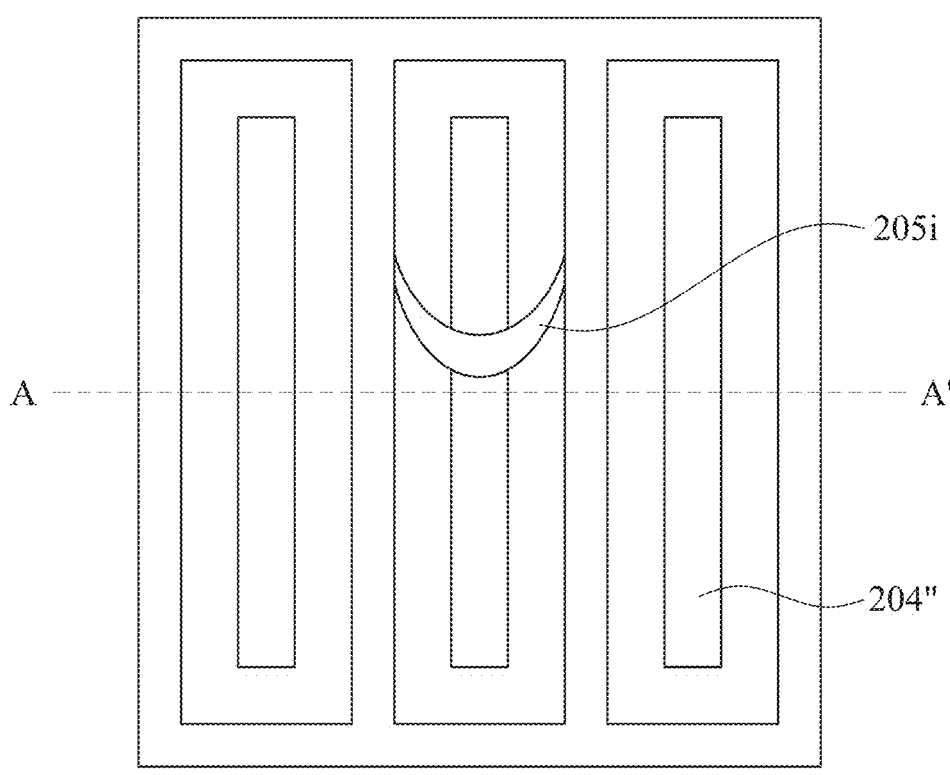
Figure 8B:
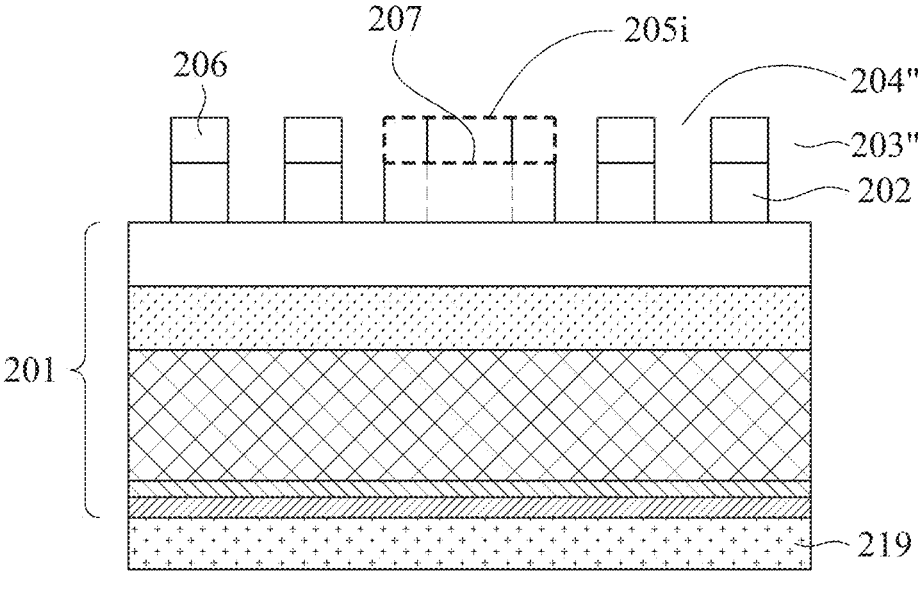

FIGS. 8A and 8B show the structure after etching the second layer 202 using the spacer layer 206 and the etch stops 205i as etch masks to leave behind the plurality of openings 204" and 203" and a plurality of cut shapes 205i. Section 207 is a portion of the second layer 202 that remains under cut shape 205i.

FIG. 9 illustrates a flow chart of a method of performing a self-aligned litho-etch patterning in accordance with another embodiment of the present disclosure. In an embodiment, the method includes, at 902, providing a substrate including a multi-layer hard mask having an amorphous silicon layer overlying a second layer overlying the substrate. In various embodiments, the second layer is tetraethyl orthosilicate.

At 904, a first plurality of openings and a plurality of cut shapes are formed within the amorphous silicon layer to expose a first portion of the second layer.

At 906, portions of the plurality of cut shapes are implanted with etch rate modifying species such as, for example, nitrogen, oxygen, fluorine, arsenic, boron, carbon, phosphorus, gallium, indium, aluminum, antimony and germanium. The type and amount of the etch rate modifying species implanted are selected to decrease the etch rate (or increase the etch resistance) of the implanted portion by at least a factor of two. The modification of the etch rate using the implanted etch rate modifying species is determined by appropriately selecting parameters such as, for example, implantation current, energy of the implanted species, time of implantation, etc.

At 908, the amorphous silicon in the unimplanted portion of the plurality of cut shapes is removed using, for example, directional etching to form etch stops. In embodiments where the implantation is performed using, for example, patterned implantation, etch stops having a size smaller than the lithographic resolution limit are obtained by removing the unimplanted portions of the plurality of cut shapes because size of the plurality of cut shapes before the directional etching is determined by the lithographic resolution limit.

At 910, a spacer layer is formed over the portions of the exposed first portion of the second layer to form a second plurality of openings. In various embodiments, the spacer layer is formed over the portions of the exposed first portion of the second layer by first depositing the spacer layer over the first layer and the exposed second layer using a conformal deposition process and then etching portion of the spacer layer using a process similar to a conventional SADP process. In other embodiments, the spacer layer is first deposited on the first layer and the exposed second layer using a conformal deposition process, and then patterning the spacer layer using a lithographic patterning process. In some embodiments, the spacer layer deposited on the side walls of the etch stops is also removed to provide cut shapes that are smaller than the lithographic resolution limit.

At 912, the amorphous silicon layer is etched to expose the portions of the second layer through the spacer layer and the etch stops.

At 914, the second layer is etched according to spacer layer pattern and the pattern of the etch stops.

Figure 10:
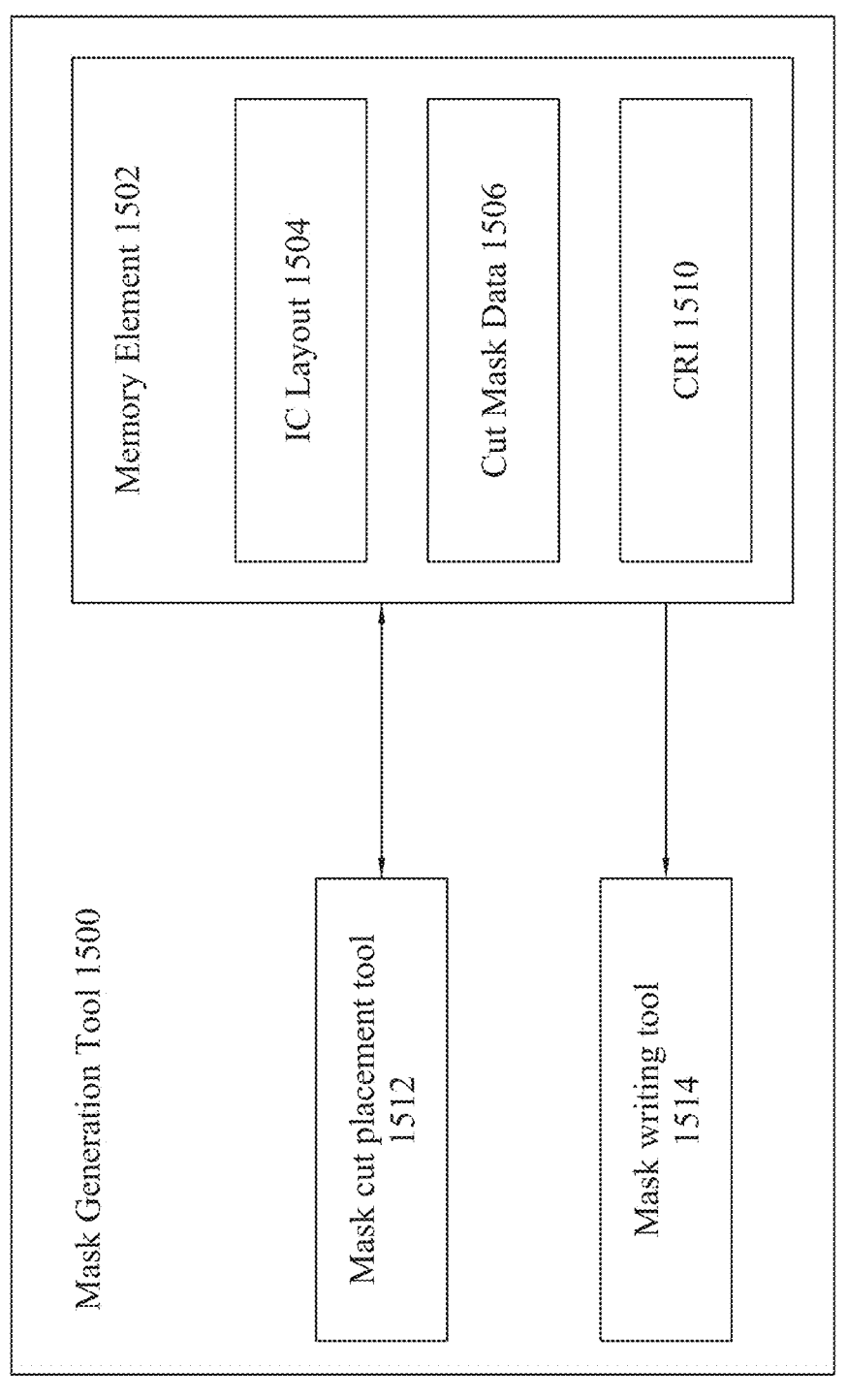
FIG. 10 illustrates an embodiment of a mask generation tool configured to generate a reusable cut mask.

FIG. 10 illustrates some embodiments of a mask generation tool 1500 configured to generate a reusable cut mask.

The mask generation tool 1500 includes a memory element 1502. In various embodiments, the memory element 1502 includes an internal memory or a computer readable medium. The memory element 1502 is configured to store an integrated circuit (IC) layout 1504 comprising a graphical representation of an integrated circuit. The IC layout 1504 includes a first plurality of shapes of a self-aligned litho-etch (SALE) design layer formed using a first SALE lithography process and a second plurality of shapes of the design layer formed using a second SALE lithography process. In some embodiments, the SALE design layer includes a design layer within a static random access memory (SRAM) cell. In some embodiments, the IC layout 1504 includes a GDS or GDSII file, a CIF file, an OASIS file, or other similar file formats.

The memory element 1502 is further configured to store first cut mask data 1506. The first cut mask data 1506 defines a position of first cut opening for the SALE design layer. In some embodiments, the memory element 1502 is further configured to store computer readable instructions 1510. The computer readable instructions 1510, in some embodiments, provide for a method of operating one or more components of the mask generation tool according to a disclosed method (e.g., method 100 or 300).

A mask cut placement tool 1512 is configured to access the IC layout 1504 and to determine a position of the first cut openings. For example, in some embodiments, the mask cut placement tool 1512 is configured to determine a location of a first cut within the first plurality of shapes from the first cut mask data 1506.

A mask writing tool 1514 is configured to access the first cut mask data 1506. Based upon the first cut mask data 1506, the mask writing tool 1514 is configured to generate a first cut mask which may be an implantation mask. The first cut mask is configured to provide openings for implantation of the top most hard mask layer at the first cut opening position.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the disclosed IC layouts are illustrated as comprising a plurality of design shapes comprising square or rectangles, it will be appreciated that such shapes are not limiting. Rather, the disclosed method and apparatus may be applied to designs having design shapes of any geometry allowed by design rules. Furthermore, the disclosed shapes may be comprised within any MPL design layer, such as for example, metal interconnect layers, polysilicon layers, active layers, etc.

The methods disclosed herein reduce the number of steps in a SALE process and also enable formation of shapes with end-to-end spacing smaller than the photolithographic resolution limit through the use of implantation of a hard mask layer with etch rate modifying species and directional etching techniques.

It will be understood that not all advantages have been necessarily discussed herein, no particular advantage is required for all embodiments or examples, and other embodiments or examples may offer different advantages.

According to an aspect of the present disclosure, a method of defining a pattern includes forming a plurality of cut shapes and a first plurality of openings within a first layer of a multi-layer hard mask of a substrate to expose first portions of the second layer. The first layer of the multi-layer hard mask is disposed on an underlying second layer. A plurality of etch stops is formed by implanting an etch rate modifying species in the first layer in a portion of each of the plurality of cut shapes. The first layer is directionally etched at the plurality of cut shapes such that the plurality of etch stops remain. A spacer layer is formed on the first layer and the first portions. A second plurality of openings is formed within the spacer layer to expose second portions of the second layer. The spacer layer is directionally etched to remove the spacer layer from sidewalls of the plurality of etch stops. Portions of the second layer of the multi-layer hard mask exposed through the first plurality of openings and the second plurality of openings are etched. In an embodiment, the first layer includes amorphous silicon. In an embodiment, the etch rate modifying species is selected from the group consisting of nitrogen, oxygen, fluorine, arsenic, boron, carbon, phosphorus, gallium, indium, aluminum, antimony, germanium and any combination thereof. In an embodiment, the etch rate modifying species decreases the etch rate of the first layer at least by a factor of two. In an embodiment, a material of the spacer layer is selected from the group consisting of silicon dioxide, silicon nitride, titanium oxide, aluminum oxide and any combination thereof. In an embodiment, the second layer is formed of TEOS (tetraethyl orthosilicate). In an embodiment, forming a plurality of cut shapes and a first plurality of openings within the first layer includes etching the first layer according to a first masking layer. In an embodiment, forming the second plurality of openings within the spacer layer includes disposing a pattern transfer layer over the spacer layer, forming a pattern corresponding to the second plurality of openings in the pattern transfer layer, and selectively etching the spacer layer according to the pattern in the pattern transfer layer.

According to another aspect of the present disclosure, a method of defining a pattern includes providing a substrate comprising a multi-layer hard mask having an amorphous silicon layer overlying a second layer. A first plurality of openings and a plurality of cut shapes are formed within the amorphous silicon layer to expose a first portion of the second layer. An etch rate modifying species is implanted in the amorphous silicon layer at portions of the plurality of cut shapes. The amorphous silicon layer is directionally etched at unimplanted portions of the plurality of cut shapes to form etch stops. A spacer layer is formed in portions of the exposed first portion of the second layer so as to expose a second portion of the second layer. The second portion corresponds to a second plurality of openings. The amorphous silicon layer is etched. The second layer is etched using the spacer layer and the etch stops as a mask. In an embodiment, the spacer layer includes a material selected from the group consisting of silicon dioxide, silicon nitride, titanium oxide, aluminum oxide and any combination thereof. In an embodiment, the etch rate modifying species is selected from the list consisting of nitrogen, oxygen, fluorine, arsenic, boron, carbon, phosphorus, gallium, indium, aluminum, antimony, germanium and any combination thereof. In an embodiment, implanting the etch rate modifying species includes implanting the etch rate modifying species at a concentration selected to decrease the etch rate of amorphous silicon by at least a factor of two. In an embodiment, forming the first plurality of openings includes disposing a first pattern transfer layer over the amorphous silicon layer, forming a first pattern corresponding to the first plurality of openings and the plurality of cut shapes in the first pattern transfer layer, and selectively etching the amorphous silicon layer exposed through the first pattern to expose the second layer at the first plurality of openings and let a portion of the amorphous silicon layer corresponding to the plurality of cut shapes remain. In an embodiment, forming the spacer layer in portions of the exposed first portion of the second layer includes disposing a spacer material over remaining portions of the amorphous silicon layer and the exposed first portions of the second layer, disposing a second pattern transfer layer on the spacer material, selectively etching the second pattern transfer layer according to a pattern corresponding to the second plurality of openings to form a second opening mask, etching portions of the spacer material exposed through the second opening mask, and removing the second pattern transfer layer. In an embodiment, forming the spacer layer in portions of the exposed first portion of the second layer includes disposing a spacer material over remaining portions of the amorphous silicon layer, sidewalls of the amorphous silicon layer, sidewalls of the etch stops and the exposed first portions of the second layer, etching the spacer material disposed over the remaining portions of the amorphous silicon layer and the exposed first portions of the second layer, and directionally etching the spacer material to remove the spacer material from the sidewalls of the etch stops. In an embodiment, the second layer includes TEOS (tetraethyl orthosilicate). In an embodiment, the second plurality of openings corresponds to a plurality of shapes having an end-to-end space defined by the etch stops.

According to yet another aspect of the present disclosure, an integrated circuit includes a plurality of shapes of a self-aligned litho-etch (SALE) design layer having end-to-end space defined by a shape opening formed by an amorphous silicon layer implanted with etch rate modifying species such that an etch rate of an implanted portion is lower by at least a factor of two than an etch rate of amorphous silicon. In an embodiment, the end-to-end space is in a range from 1 nm to 100 nm. In an embodiment, the SALE design layer comprises a design layer within a static random access memory (SRAM) array.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor device, the method comprising:

forming an opening in a first layer to expose a second layer underlying the first layer;

converting a first portion of the first layer to a mask by modifying an etch rate characteristic of the first portion of the first layer proximal to the opening;

directionally etching to remove a second portion of the first layer without removing the first portion of the first layer converted to the mask to further expose the second layer; and etching the second layer using the mask as an etching mask.

2. The method of claim 1, wherein modifying the etch rate characteristic of the first portion of the first layer includes implanting the first portion of the first layer with one or more etch rate modifying species.

3. The method of claim 2, wherein the one or more etch rate modifying species are selected from nitrogen, oxygen, fluorine, arsenic, boron, carbon, phosphorus, gallium, indium, aluminum, antimony, and germanium.

4. The method of claim 2, wherein implanting the first portion of the first layer with the one or more etch rate modifying species increases an etch resistance of the first portion of the first layer by at least a factor of two when compared to an etch resistance of an un-implanted portion of the first layer that is not implanted with the one or more etch rate modifying species.

5. The method of claim 1, wherein the first layer includes a semiconductor material.

6. The method of claim 5, wherein the second layer includes a dielectric material.

7. A method of manufacturing a semiconductor device, the method comprising:

forming an opening in a first layer to expose a second layer underlying the first layer;

forming a mask by modifying an etch rate characteristic of a first portion of the first layer proximal to the opening;

directionally etching to remove a second portion of the first layer without removing the mask to further expose the second layer;

forming a spacer layer over a third portion of the first layer, the mask, and the exposed second layer;

forming a first pattern through the spacer layer to expose the second layer;

forming a second pattern by removing the first layer to further expose the second layer; and etching using the mask and the spacer layer to extend the second pattern and expose an underlying substrate.

8. The method of claim 7, wherein a first portion of the second layer remains under the mask after exposing the underlying substrate.

9. The method of claim 8, wherein a second portion of the second layer remains under the spacer layer after etching to expose the underlying substrate.

10. The method of claim 7, wherein forming the opening in the first layer includes performing a lithographic process comprising depositing a pattern transfer layer on the first layer, forming a pattern in the pattern transfer layer, and etching the first layer through the pattern.

11. The method of claim 7, wherein modifying the etch rate characteristic of the first portion of the first layer includes implanting the first portion of the first layer with one or more etch rate modifying species.

12. The method of claim 11, wherein implanting the first portion of the first layer with the one or more etch rate modifying species increases an etch resistance of the first portion of the first layer by at least a factor of two when compared to an etch resistance of an un-implanted portion of the first layer that is not implanted with the one or more etch rate modifying species.

13. The method of claim 7, wherein the spacer layer is conformally formed over a sidewall and a top of the third portion of the first layer, over a sidewall and a top of the mask, and over the exposed second layer.

14. A method of manufacturing a semiconductor device, the method comprising:

providing a layered structure comprising a first layer, a substrate, and a second layer between the first layer and the substrate;

forming an opening in the first layer to expose the second layer;

forming a mask by modifying an etch rate characteristic of a first portion of the first layer proximal to the opening;

directionally etching to remove a second portion of the first layer without removing the mask to further expose the second layer;

forming a spacer layer over the second layer and a sidewall of a third portion of the first layer;

patterning a hole through the spacer layer to expose the second layer;

removing the first layer; and patterning the second layer using the mask and the spacer layer as etching masks.

15. The method of claim 14, wherein modifying the etch rate characteristic of the first portion of the first layer includes implanting the first portion of the first layer with one or more etch rate modifying species.

16. The method of claim 15, wherein implanting the first portion of the first layer with the one or more etch rate modifying species increases an etch resistance of the first portion of the first layer by at least a factor of two when compared to an etch resistance of an un-implanted portion of the first layer that is not implanted with the one or more etch rate modifying species.

17. The method of claim 14, further comprising removing a portion of the spacer layer from sidewalls of the mask before patterning the second layer.

18. The method of claim 14, wherein the first layer includes a semiconductor material.

19. The method of claim 18, wherein the second layer includes a dielectric material.

20. The method of claim 14, wherein patterning the second layer extends the hole to expose the substrate.

* * * * *